United States Patent
Zheng et al.

(10) Patent No.: US 11,183,788 B2
(45) Date of Patent: Nov. 23, 2021

(54) ELECTRICAL CONNECTOR FOR A CONTROLLER

(71) Applicant: Honeywell International Inc., Morris Plains, NJ (US)

(72) Inventors: Michael Zheng, Beijing (CN); Ke Zhang, Beijing (CN); Haitao Li, Beijing (CN); Yong Mu, Beijing (CN); Kun Wang, Beijing (CN); Wei Guo, Beijing (CN); Yingjie Zhang, Beijing (CN); Xinyan Zheng, Beijing (CN)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/837,579

(22) Filed: Apr. 1, 2020

(65) Prior Publication Data
US 2021/0313725 A1    Oct. 7, 2021

(51) Int. Cl.
  *H01R 13/11*    (2006.01)
  *H01R 13/18*    (2006.01)
  (Continued)

(52) U.S. Cl.
  CPC ......... *H01R 13/11* (2013.01); *H01R 12/7076* (2013.01); *H01R 13/18* (2013.01);
  (Continued)

(58) Field of Classification Search
  CPC .... H01R 13/11; H01R 13/18; H01R 12/7076; H01R 43/20; H05K 1/18; H05K 7/1432; H05K 7/1474; H05K 7/1482
  (Continued)

(56) References Cited

U.S. PATENT DOCUMENTS

| | | | | |
|---|---|---|---|---|
| 3,239,798 A | * | 3/1966 | Silver | H01R 31/00 439/631 |
| 4,897,054 A | * | 1/1990 | Gilissen | H01R 12/7082 439/287 |

(Continued)

FOREIGN PATENT DOCUMENTS

| CN | 104184305 A | 12/2014 |
|---|---|---|
| EP | 1445493 A1 | 9/2006 |

OTHER PUBLICATIONS

Loytec Electronics (SER# 014503-900000100394), 1 page, prior to Jan. 22, 2020.

(Continued)

*Primary Examiner* — Peter G Leigh
(74) *Attorney, Agent, or Firm* — Seager, Tufte & Wickhem, LLP

(57) ABSTRACT

An electronic device including a plurality of ports for electrically connecting the device to another device. The electronic device may include a housing including a front, a back and at least a first side and an opposing second side extending between the front and the back, a printed circuit board housed by the housing, and an electrical connector electrically connected to the printed circuit board. The electrical connector may include a first spring contact, a second spring contact, and an electrically conductive bridge mechanically and electrically connecting the first spring contact and the second spring contact. The electrically conductive bridge may be housed by the housing. The first and second spring contacts may extend outside of the housing and may be accessible from the first and second sides of the housing, respectively.

18 Claims, 10 Drawing Sheets

(51) Int. Cl.
*H01R 43/20* (2006.01)
*H05K 1/18* (2006.01)
*H05K 7/14* (2006.01)
*H01R 12/70* (2011.01)

(52) U.S. Cl.
CPC .............. *H01R 43/20* (2013.01); *H05K 1/18* (2013.01); *H05K 7/1432* (2013.01); *H05K 7/1474* (2013.01); *H05K 7/1482* (2013.01)

(58) Field of Classification Search
USPC ................................................ 439/816, 928
See application file for complete search history.

(56) References Cited

U.S. PATENT DOCUMENTS

| | | | |
|---|---|---|---|
| 4,956,747 A | 9/1990 | Beer et al. | |
| 5,695,353 A * | 12/1997 | Sakata | H01R 12/83 439/326 |
| 5,888,096 A | 3/1999 | Soes et al. | |
| 6,000,970 A * | 12/1999 | Wu | H01R 24/58 439/668 |
| 6,152,742 A * | 11/2000 | Cohen | H01R 13/502 439/60 |
| 6,270,380 B1 * | 8/2001 | Shichida | H01R 23/26 439/669 |
| 6,424,547 B2 * | 7/2002 | Murabayashi | H02J 1/10 363/65 |
| 7,182,648 B2 * | 2/2007 | Han | G02B 6/4277 385/75 |
| 7,361,062 B2 * | 4/2008 | Long | H01R 24/58 439/668 |
| 8,070,528 B2 * | 12/2011 | Wang | H01R 24/58 439/668 |
| 8,986,033 B2 * | 3/2015 | Berger | H05K 7/1478 439/341 |
| 9,124,014 B2 * | 9/2015 | Zhang | H01R 13/40 |
| 9,583,849 B1 * | 2/2017 | Wu | H01R 9/2675 |
| 9,864,352 B2 * | 1/2018 | Kang | H05K 7/1478 |
| 9,935,388 B2 * | 4/2018 | Tziviskos | H01R 13/187 |
| 10,314,194 B1 | 6/2019 | Chiang | |
| 2005/0245104 A1 * | 11/2005 | Nakagawa | H01R 24/42 439/63 |
| 2008/0315748 A1 * | 12/2008 | Kitada | H01J 29/925 313/477 HC |
| 2016/0204532 A1 * | 7/2016 | Ishida | H05K 1/028 439/61 |

OTHER PUBLICATIONS

SAUTER Creating Sustainable Environments, "SAUTER modulo system description", pp. 90, prior to Apr. 1, 2020.
Siemans, "Simatic ET 200SP HA", pp. 3, Dec. 6, 2019.
European Extended Search Report, EP Application No. 21163017.3, dated Aug. 6, 2021 (8 pages).

* cited by examiner

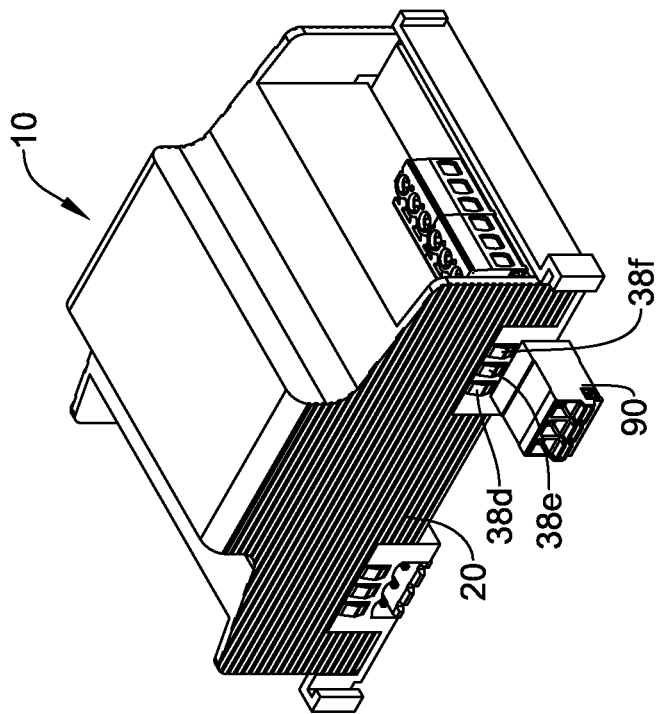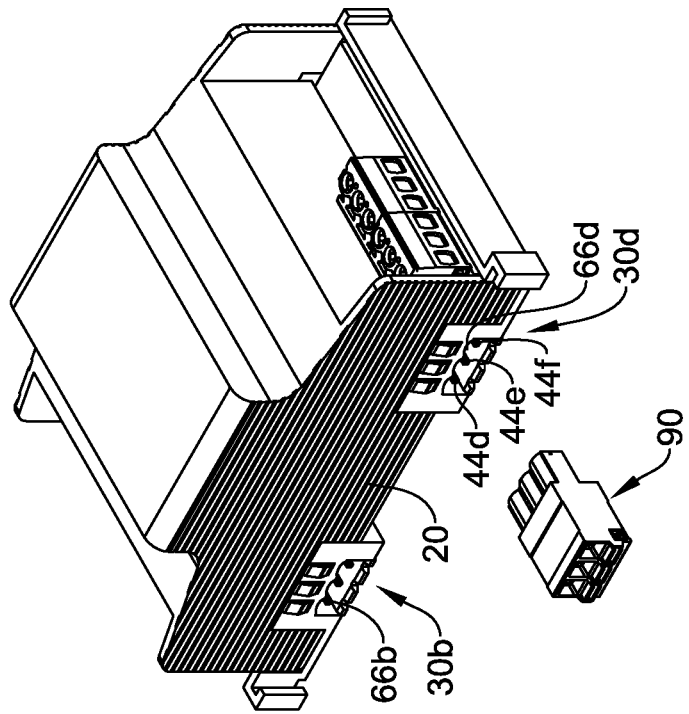
FIG. 9

ELECTRICAL CONNECTOR FOR A CONTROLLER

TECHNICAL FIELD

The present disclosure relates to electrical connectors, and more particularly, to electrical connectors for electrically connecting two or more controllers and/or other devices.

BACKGROUND

Automation, process control and other systems often use various controllers and/or other devices. In some instances, it is desirable to electrically connect two or more of the controllers and/or other devices. This is often accomplished using wires or cables. What would be desirable is an improved electrical connector for electrically connecting two or more controllers and/or other devices.

SUMMARY

The present disclosure relates to electrical connectors, and more particularly, to electrical connectors for electrically connecting two or more controllers and/or other devices.

In one example, a controller may include a housing having a front, a back and at least a first side and an opposing second side extending between the front and the back. A printed circuit board may be housed by the housing. An electrical connector may be electrically connected to the printed circuit board. The electrical connector may include a first spring contact, a second spring contact, and an electrically conductive bridge mechanically and electrically connecting the first spring contact and the second spring contact. The electrically conductive bridge may be housed by the housing. The first spring contact may extend outside of the housing and may be accessible from the first side of the housing and the second spring contact may extend outside of the housing and may be accessible from the second opposing side of the housing. When a controller with a similar electrical connector is placed next to the first side or the second side, the spring contacts may electrically connect.

In another example, a device may include a housing that has a front, a back and at least a first side and an opposing second side extending between the front and the back. A printed circuit board may be housed by the housing. An electrical connector may be electrically connected to the printed circuit board. The electrical connector may include a base housed by the housing and electrically connected to the printed circuit board. The electrical connector may further include a spring contact mechanically and electrically connected to the base. The spring contact may extend outside of the housing and may be accessible from the first side of the housing. The electrical connector may further include a terminal pin mechanically and electrically connected to the base. The terminal pin may extend outside of the housing and may be accessible from the first side of the housing. This may be considered a combination electrical connector.

In another example, an electrical connector may include a base, a spring contact mechanically and electrically connected to the base, and a terminal pin mechanically and electrically connected to the base. The spring contact may extend away from the base in a first direction. The terminal pin may extend away from the base in the first direction and may be offset from the spring contact.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which:

FIG. 9 is a perspective view of another illustrative method for coupling an electronic device to another electronic device.

Figure 1:
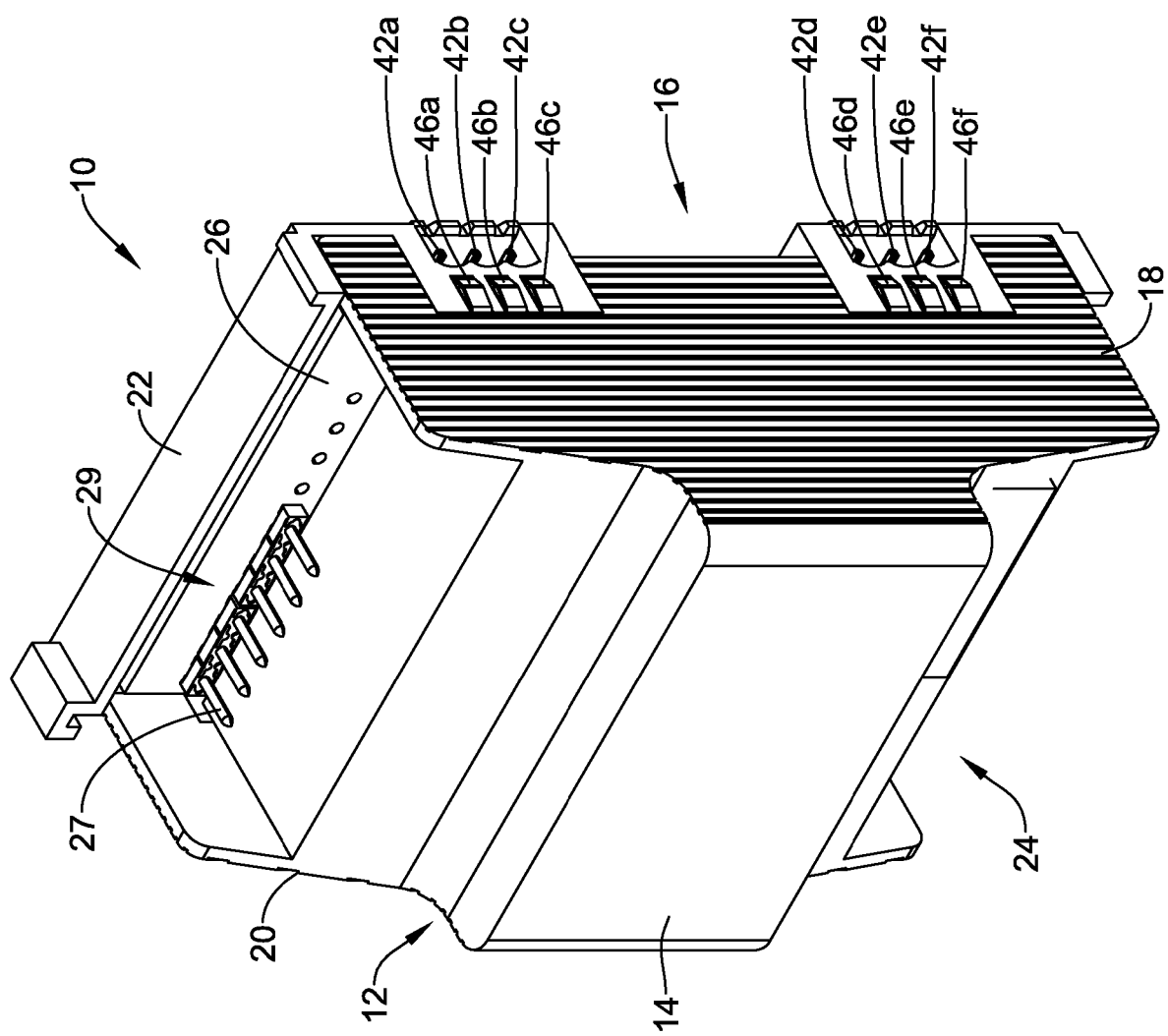
FIG. 1 is a perspective view of an illustrative but non-limiting electronic device.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

It is contemplated that the present electrical connector may be used to connect any suitable electrical devices. However, to help illustrate, the present electrical connector is described with reference to an automation and/or process control system. Such systems may include a controller and a plurality of electrical control devices or input/output (I/O) devices. In some instances, the controller may include control circuitry and logic configured to operate, control, command, etc. the various components of a control system. In some cases, the controller may provide these instructions to I/O devices which in turn may relay the control commands to the components of the system. In some instances, the components of the system may provide information related to the system, such as sensor readings, environmental conditions, etc. to the I/O device which in turn may relay some or all of this data to the controller. In some cases, the controller and/or I/O devices may be mounted along a DIN rail, bus bar or other mounting arrangement. To facilitate control of the various devices and/or communication therebetween, the controller, I/O devices, and/or process devices may be electrically and communicatively coupled to one another. To facilitate coupling and uncoupling of the devices, it may be desirable to provide the electronic devices with more than one option for electrically coupling the devices to one another. It may also be desirable to facilitate the coupling and uncoupling of the devices without having to move other electrical devices that are mounted adjacent to the controller on a DIN rail or the like. These are just examples.

FIG. 1 is a perspective view of an illustrative but non-limiting electronic device 10 having a housing 12. The electronic device 10 may be a controller, an I/O device or any other electronic device. The features described herein may be applied to controllers, process devices, sensors, etc. The illustrative housing 12 includes a front side 14, a back side 16, and at least a first side 18, and a second opposing side 20. The first and second sides 18, 20 may each extend from or between the front 14 to the back 16. The housing 12 may further include a top 22 and an opposing bottom 24. The top and bottom 22, 24 may extend from or between the first and second sides 18, 20. The use of the terms "front", "back", "first", "second", "top", and "bottom" are not intended to limit the electronic device 10 to a particular orientation, but rather facilitate discussion of relative orientation. Further, the housing 12 is not limited to a rectangular or generally rectangular structure. Other shapes may be used for the housing 12, as desired.

The electronic device 10 may further include a printed circuit board (PCB) 26. The PCB 26 may be completely or partially housed within the housing 12. While not explicitly shown, the PCB 26 may include electrical and/or electronic components that may include control logic and/or communication capabilities. These components may be electrically connected to one another and mechanically fastened to the PCB 26. In some cases, the PCB 26 may include a plurality of pins 27 positioned exterior to the housing 12 extending towards the front 14 thereof. The pins 27 may form one or more front facing connector(s) 29 that face and are accessible from the front 14 of the housing 12. While not explicitly shown, the electronic device 10 may include other pins, terminal connectors, etc. for coupling the PCB 26 to other devices.

Figure 2:
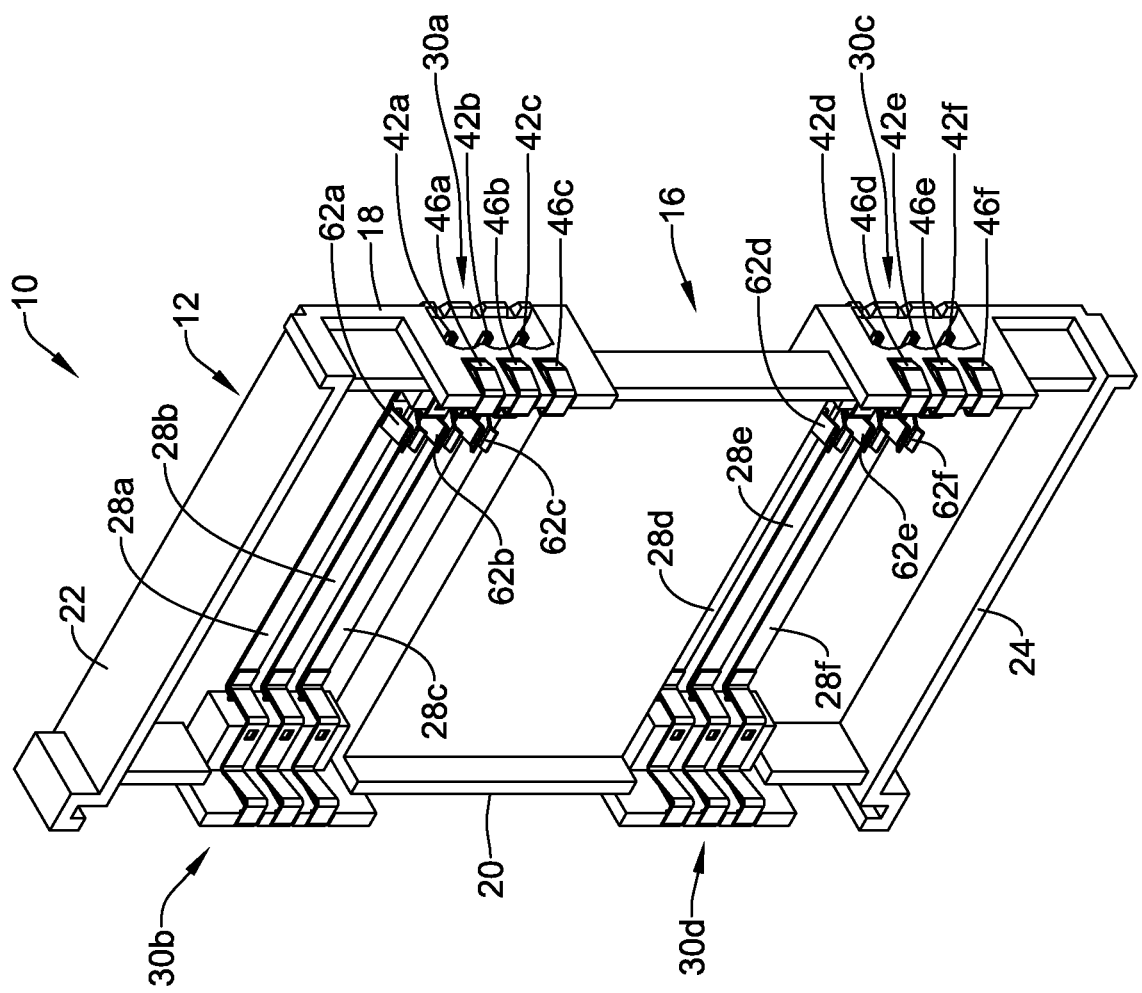
FIG. 2 is a perspective view of the illustrative electronic device of FIG. 1 with some components removed.

FIG. 2 is a perspective view of the illustrative electronic device 10 of FIG. 1 with the front 14 of the housing 12 and the PCB 26 removed. The electronic device 10 may include one or more electrical connectors 28a-f (collectively, 28). Each of the electrical connectors 28 may be electrically connected to the PCB 26 (e.g. via terminal receiving slot 62a-f) and may be configured to electrically couple the PCB 26 of the electronic device 10 to other devices. The electronic device 10 may include any number of electrical connectors 28 as desired. The electrical connectors 28 may be grouped together to form ports 30a-d (collectively, 30). For example, the number of electrical connectors 28 provided may depend on how the electronic device 10 is to be connected to another electronic device. For example, a first port type may require three electrical connectors to form a port 30a. A first electrical connector 28a of the port may be for power, a second electrical connector 28b of the port 30a may be for ground, and a third electrical connector 28c of the port 30a may be for data. Another port type (e.g. RS485) may require six electrical connectors 28a-f to form two ports 30a, 30c. The first port 30a may be for power while the second port 30c is for data. These are just examples. In some cases, the electrical connectors 28 may extend from the first side 18 of the housing 12 to the second side 20 of the housing 12 such that each group of three electrical connectors 28a-c, 28d-f forms two ports 30a, 30b and 30c, 30d, respectively. It should be understood that the ports 30a, 30c provided on the first side 18 may be connected to a first device while the ports 30b, 30d on the second side 20 may be connected to a second, different device. For example, the ports 30a, 30c may be for receiving an input and/or delivering an output from a first device while the ports 30b, 30d may be for receiving an input and/or delivering an output to a second or different device. In some cases, only two of the ports may be provided. For example, two of the ports (e.g., port 30a and port 30b or port 30c and port 30d) may not be present. In some cases, only one port may be provided.

Figure 3:
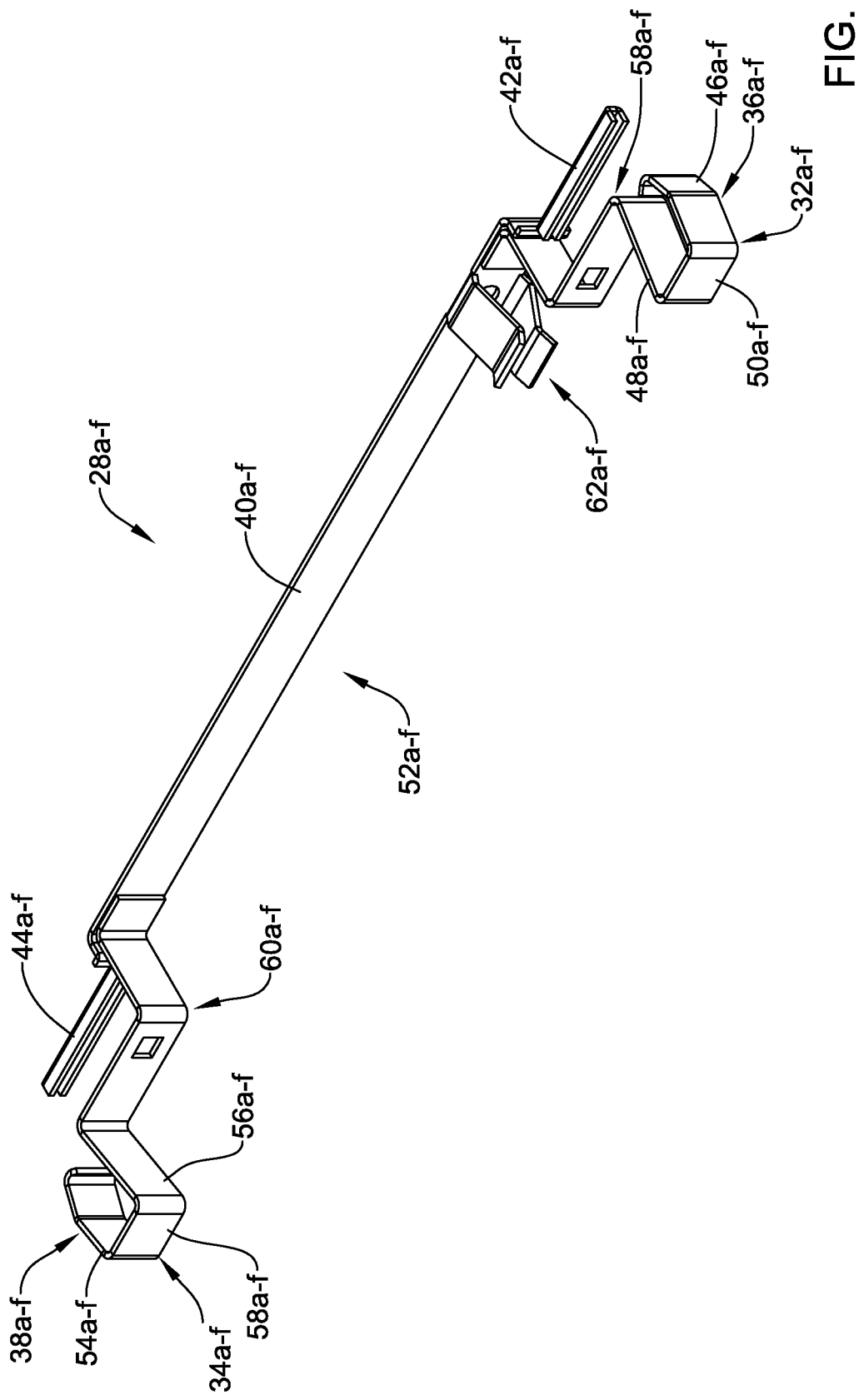
FIG. 3 is a perspective view of one of a plurality of electrical conductors of FIG. 2 shown in detail.

FIG. 3 is a perspective view of one of the plurality of electrical conductors 28a-f of FIG. 2 shown in detail. In the example shown, each electrical conductor 28a-f of the electronic device 10 has an identical structure to that described with respect to FIG. 3. However, in other examples, one or more of the electrical conductors 28a-f may have a different structure. The electrical conductor 28a-f extend from a first end 32a-f to a second end 34a-f. The electrical conductor 28a-f may include a first touch flake or spring contact 36a-f adjacent to the first end 32a-f thereof and a second touch flake or spring contact 38a-f adjacent to the second end 34a-f thereof. Each spring contact 36a-f, 38a-f may be mechanically and electrically connected or coupled to and extend from a base or an electrically conductive bridge 40a-f. The electrical conductor 28a-f may further include a first terminal pin 42a-f adjacent to the first end 32a-f thereof and a second terminal pin 44a-f adjacent to the second end 34a-f thereof. In some cases, the first and second terminal pins 42a-f, 44a-f may extend generally parallel to a longitudinal axis of the conductive bridge 40a-f, although this is not required. Each terminal pin 42a-f, 44a-f may be mechanically and electrically connected or coupled to and extend from the electrically conductive bridge 40a-f. The conductive bridge 40a-f may mechanically and electrically connect all of the first and second spring contacts 36a-f, 38a-f and the first and second terminal pins 42a-f, 44a-f. In some cases, the first and second spring contacts 36a-f, 38a-f, the first and second terminal pins 42a-f, 44a-f, and the conductive bridge 40a-f may be formed as a single monolithic structure. For example, the electrical conductor 28a-f may be stamped from a single monolithic electrically conductive material. In other cases, one or more of the first and second spring contacts 36a-f, 38a-f, the first and second terminal pins 42a-f, 44a-f, and/or the conductive bridge 40a-f may be formed as a discrete structure and subsequently coupled to the other components. Some illustrative, but non-limiting, coupling techniques may include, but are not limited to, welding, soldering, brazing, etc.

In some cases, either the spring contacts 36a-f, 38a-f or the terminal pins 42a-f, 44a-f may be used to form an electrical connection with another device. For example, as will be described in more detail herein, the spring contacts 36a-f, 38a-f may be brought into contact with similar spring contacts of another device to form an electrical connection therebetween. In another example, a female terminal connector may be coupled with the terminal pins 42a-f, 44a-f. In some cases, the spring contacts 36a-f on the first side 18 may be used to couple the electronic device 10 with one device while the terminal pins 44a-f on the second side 20 may be used to couple the electronic device 10 with a second different device. The reverse configuration is also contemplated.

The first spring contact 36a-f may generally have a shape which allows it to flex under an applied force. For example, the first spring contact 36a-f may have a generally "U" shaped configuration include a first flexible arm 46a-f, a second arm 48a-f, and an interconnecting arm 50a-f extending between and generally orthogonal to the first flexible arm 46a-f and the second arm 48a-f. The first flexible arm 46a-f may be configured to flex towards an intermediate region 52a-f of the electrical conductor 28 under an applied force, although this is not required, as will be described in more detail herein. Similarly, the second spring contact 38a-f may have a generally "U" shaped configuration include a first flexible arm 54a-f, a second arm 56a-f, and an interconnecting arm 58a-f extending between and generally orthogonal to the first flexible arm 54a-f and the second arm 56a-f. The first flexible arm 54a-f may be configured to flex towards an intermediate region 52a-f of the electrical conductor 28 under an applied force, although this is not required, as will be described in more detail herein.

The first spring contact 36a-f may be coupled or connected to the conductive bridge 40a-f via a connecting portion 58a-f. The connecting portion 58a-f may have an "L" or stepped configuration such that the first spring contact 36a-f is laterally spaced or offset from the conductive bridge 40a-f, although this is not required. In some cases, the connecting portion may generally match or conform to a stepped configuration in the housing 12. Similarly, the second spring contact 38a-f may be coupled or connected to the conductive bridge 40a-f via a connecting portion 60a-f. The connecting portion 60a-f may have an "L" or stepped configuration such that the second spring contact 38a-f is laterally spaced or offset from the conductive bridge 40a-f, although this is not required. In some cases, the connecting portion may generally match or conform to a stepped configuration in the housing 12, as will be described in more detail herein.

Figure 4:
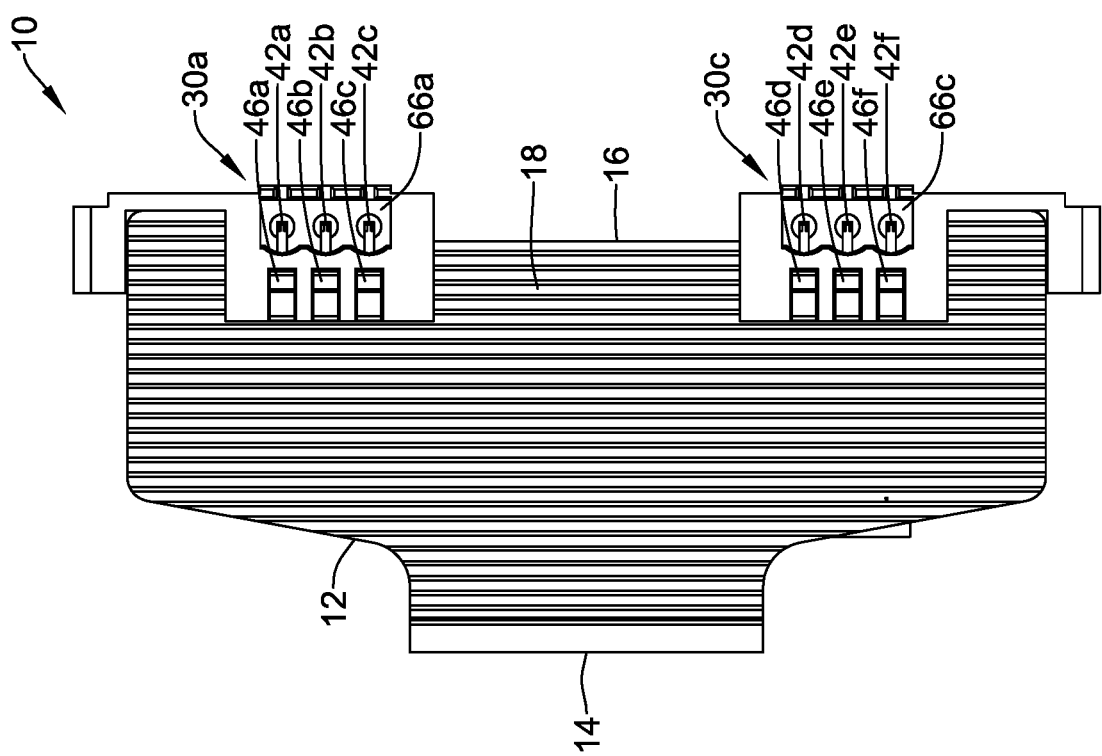
FIG. 4 is a first side view of the illustrative electronic device of FIG. 1.
Figure 5:
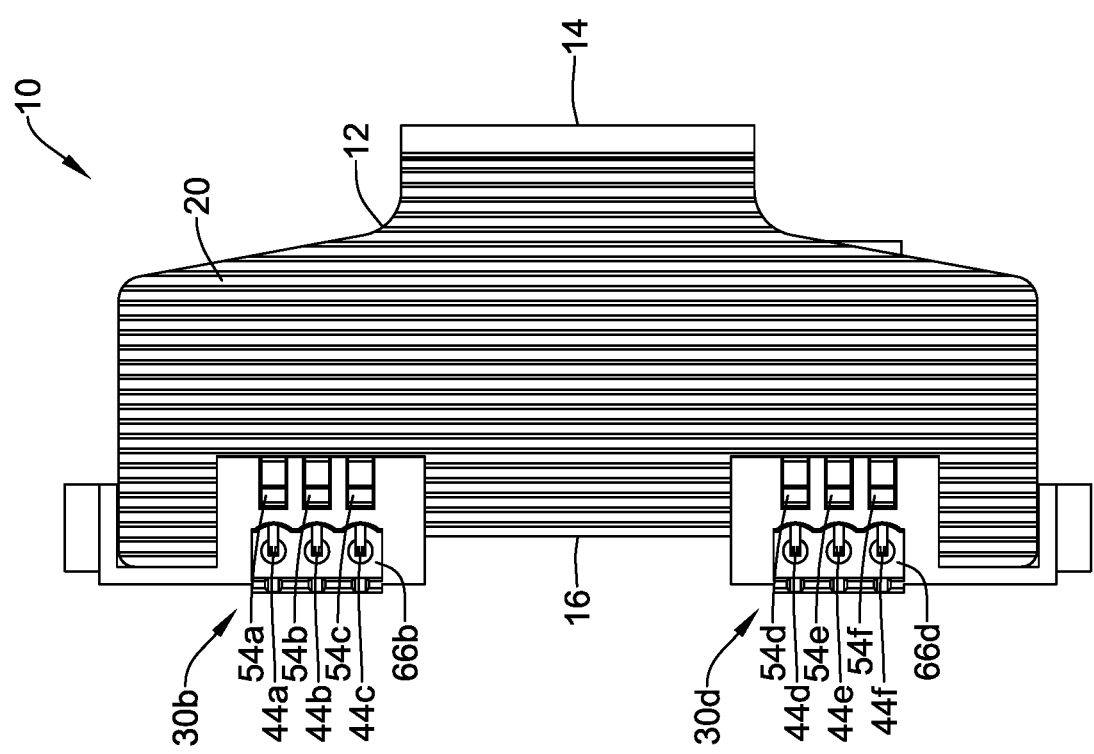
FIG. 5 is a second side view of the illustrative electronic device of FIG. 1.

Returning briefly to FIG. 2, the conductive bridge 40a-f may be housed by or within the housing 12 and may extend from a location adjacent to the first side 18 to a location adjacent to the second side 20. Referring additionally to FIGS. 4 and 5 which illustrate a first side view and a second side view, respectively, of the electronic device 10, at least a portion of the first and second spring contacts 36a-f, 38a-f extend outside of the housing 12 or are otherwise accessible from outside of the housing 12. For example, the first flexible arm 46a-f of the first spring contact 36a-f may extend from and/or be accessible from the first side 18 of the housing 12, as shown in FIG. 4. Similarly, the first flexible arm 54a-f of the second spring contact 38a-f may extend from and/or be accessible from the second side 20 of the housing 12, as shown in FIG. 5. It is further contemplated that the first terminal pins 42a-f, may extend outside of housing 12 and/or be accessible from the first side 18 of the housing 12, as shown in FIG. 4. Similarly, the second terminal pins 44a-f may extend outside of housing 12 and/or be accessible from the second side 20 of the housing 12, as shown in FIG. 5.

In some cases, the first and/or second terminal pins 42a-f, 44a-f may be accessible within or from a recess or terminal port 66a-d defined by the housing 12. For example, the first side 18 of the housing 12 may define a first terminal port 66a for receiving a female terminal connector (not explicitly shown). Similarly, the second side 20 of the housing 12 may define a second terminal port 66b for receiving a female terminal connector (not explicitly shown). In some cases, the first side 18 of the housing 12 may define a third terminal port 66c for receiving a female terminal connector (not explicitly shown) and the second side 20 of the housing 12 may define a fourth terminal port 66d for receiving a female terminal connector (not explicitly shown).

Returning to FIG. 3, the electrical conductor 28a-f may further include a terminal receiving slot 62a-f. In some cases, the terminal receiving slot 62a-f may extend generally orthogonal to a longitudinal axis of the conductive bridge 40a-f, although this is not required. The terminal receiving slot 62a-f is configured to slidably receive a connection pin (see, for example, FIG. 8) of the PCB 26 that extends from the PCB 26 towards the back 16 of the housing 12 to electrically connect the electrical conductor 28a-f to the PCB 26. In some cases, the terminal receiving slots 62a-f may be a two-pronged structure, wherein the prongs are configured to bend slightly away from each other when receiving the connection pin of the PCB 26 to help provide a good tight electrical connection. However, other configurations for electrically coupling the electrical conductor 28a-f with the PCB 26 may be used, as desired.

Figure 6:
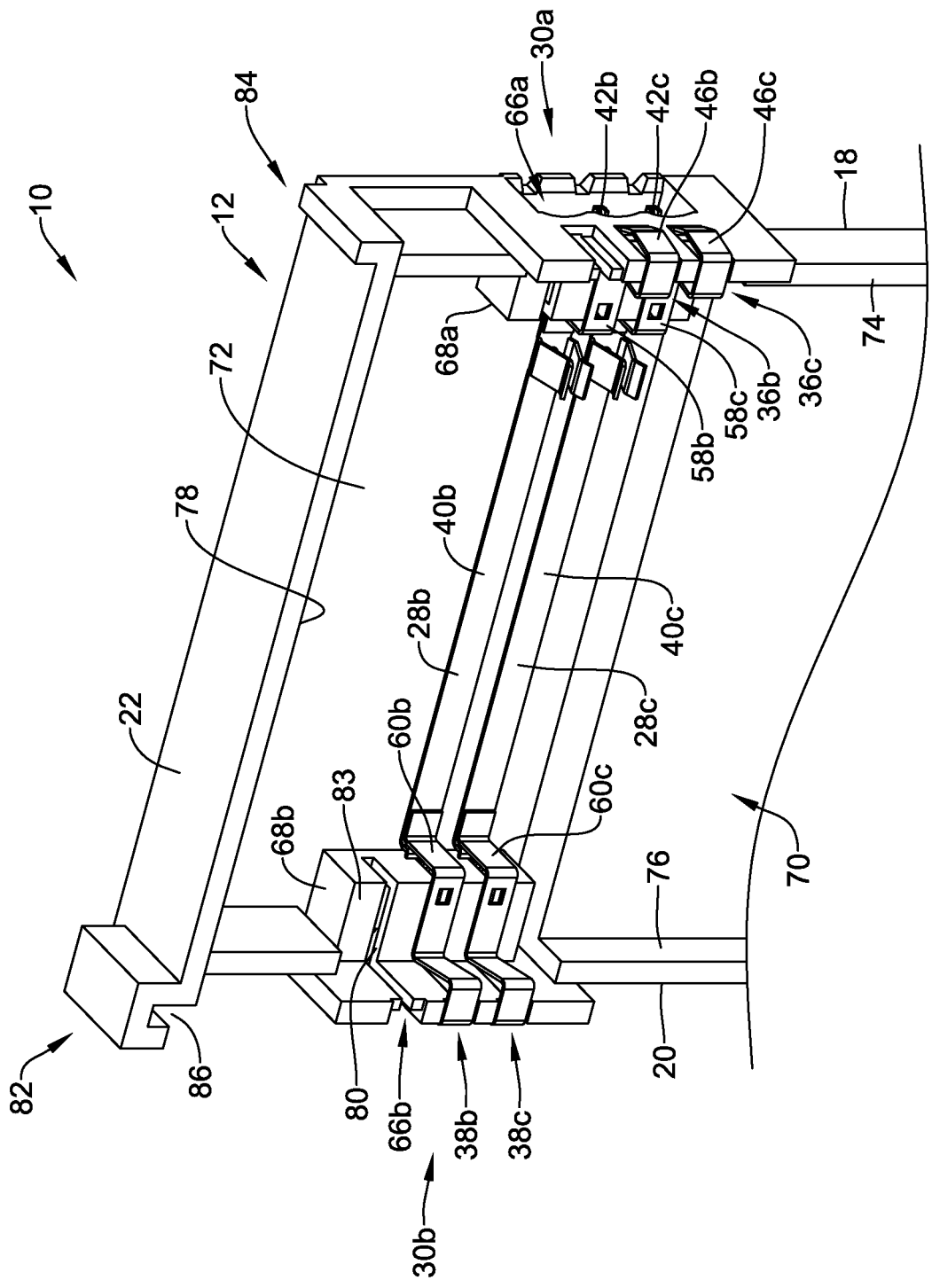
FIG. 6 is an enlarged perspective view of a top portion of the illustrative electronic device of FIG. 1 with some components removed.

FIG. 6 is an enlarged perspective view of a top portion of the illustrative electronic device 10 of FIG. 1 with the front 14 of the housing 12 and the PCB 26 removed. In FIG. 6, one of the electrical conductors 28a has been removed to more particularly illustrate the structure of the housing 12. While the Figure is described with respect to ports 30a, 30b and the corresponding electrical conductor 28b, electrical conductor 28c, it should be understood that ports 30c, 30d and the corresponding electrical conductor 28d-f, as well as electrical conductor 28a, will have the same structure. The housing 12 may include an inner cavity 70 that is defined by a back inner wall 72, a first inner side wall 74, a second opposing inner side wall 76, a top inner wall 78, and a bottom inner wall (not explicitly shown). One or more portions of the back wall 72 may be laterally offset to form the ports 66a-b to form a generally hollow step or ledge 68a, 68b. The terminal ports 66a, 66b are formed within these steps 68a, 68b. The electrically conductive bridges 40b, 40c extend between the steps 68a, 68b and are housed within the cavity 70 of the housing 12. The connecting portions 58b, 58c, 60b, 60c of the electrical conductor 28b and electrical conductor 28c, respectively, may be shaped to generally conform to the profile of the outer surface of the steps 68a, 68b. This may laterally space the first spring contacts 36b, 36c from the first terminal pins 42b, 42c and the second spring contacts 38b, 38c from the second terminal pins 44b, 44c (not explicitly shown).

The steps 68a, 68b may each include a plurality of slots 80 extending therethrough. While only a single slot 80 is shown, it should be understood that the each step 68a, 68b may include a slot 80 for each electrical conductor 28. The slots 80 may extend through a thickness of the wall from a top surface 83 and into the terminal port 66b. The slot 80 may also extend along the width of the step 68a. This may allow the electrical conductor 28 to be assembled with the housing 12 by lowering the first and second terminal pins 42, 44 through the slots 80 and into the terminal ports 66a, 66b. When assembled, the connecting portions 58b, 58c, 60b, 60c of the electrical conductor 28b and electrical conductor 28c, respectively, may rest on the steps 68a, 68b and engages an inside surface of the housing 12. In some cases, a portion of the spring contacts 36b, 36c, 38b, 38c (for example, the second arms 48b, 48c, 56b, 56c and/or interconnecting arms 50b, 50c, 58b, 58c) may also engage an inner surface of the housing 12. In some cases, a portion of the spring contacts 36b, 36c, 38b, 38c (for example, the first arms 46b, 46c, 54b, 54c (not explicitly shown)) may engage an outer surface of the housing 12. For example, the first arms 46b, 46c of the first spring contact 36b, 36c may engage an outside surface of the first side 18 of the housing 12 while the first arms 54b, 54c of the second spring contact 38b, 38c may engage an outside surface of the second side 20 of the housing 12.

In some embodiments, the housing 12 may further include features configured to align and couple the electronic device 10 with another device. For example, the housing 12 may include an interconnection structure 82 that is configured to releasably couple with a mating structure, such as a tab 84 on an adjacent device. The interconnection structure 82 may be a generally "U" shaped bracket defining a slot 86. The slot 86 may be configured to slide over a tab 84 on another device to align and connect the two devices. It is contemplated that the tab 84 may be positioned on one side of the device 10 while the interconnection structure 82 is placed on the opposing side of the device 10. This is just one illustrative example. Other connection structures may be used as desired. Further, in some cases, the interconnection structure may not be present.

Figure 7:
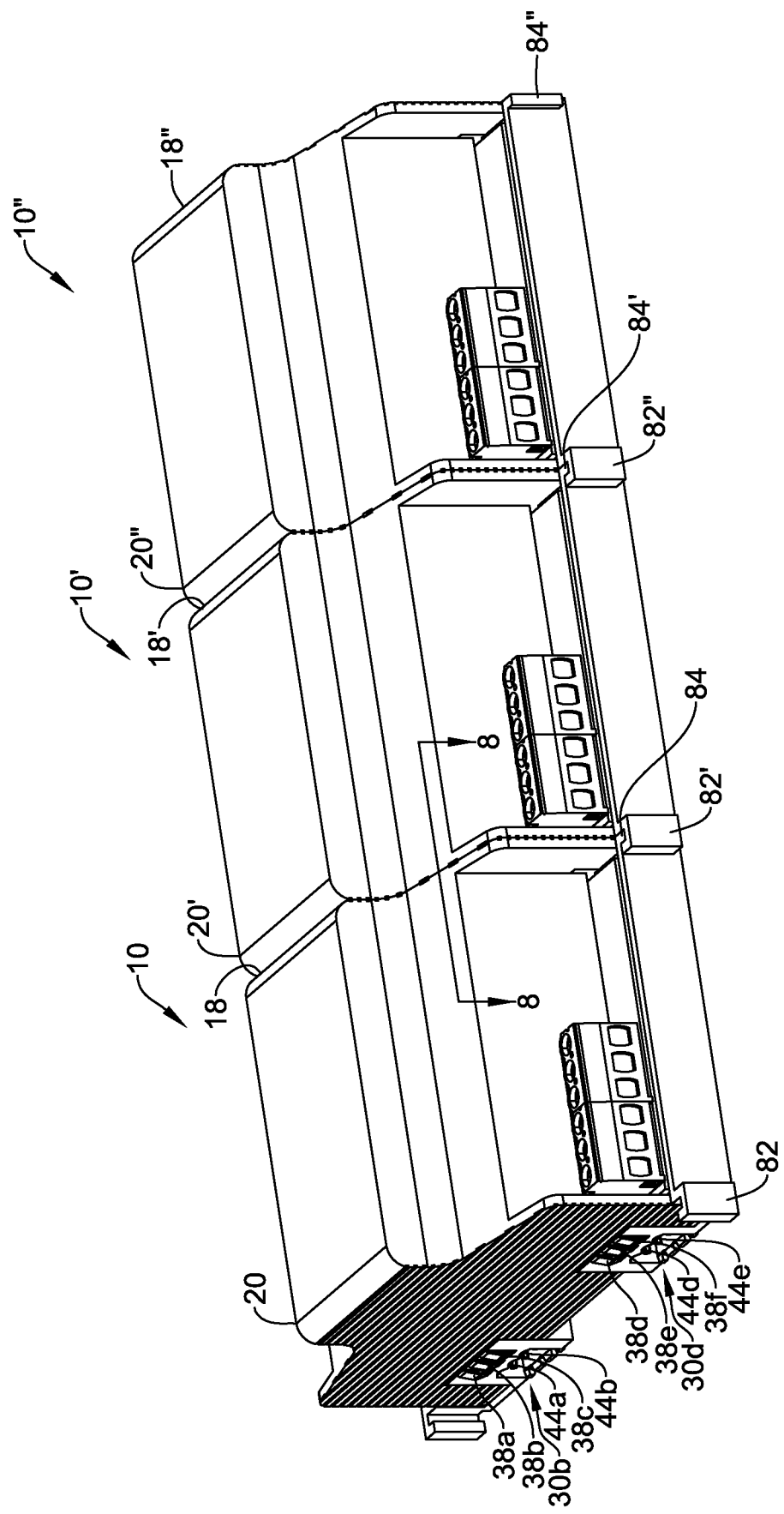
FIG. 7 is a perspective view of a plurality of interconnected electronic devices.

FIG. 7 is a perspective view of a plurality of interconnected devices 10, 10', and 10". The devices 10, 10', 10" may be identical or substantially identical to one another. To facilitate discussion, like part elements of the second device 10' and third device 10" will be identified with the same reference numeral as the first device 10 followed by a ' for the second device 10' and "for the second device 10". Each device 10, 10', 10" includes a PCB (not explicitly shown) and a plurality of electrical connectors configured to electrically the PCB with other devices, such as the electrical connectors 28 described herein. As described above, and in the example shown, the electrical connectors are grouped to form electrical connections and ports on opposing sides of the devices. FIG. 7 illustrates ports 30b, 30d, on a single side 20 of the first device 10. However, it should be understood that the opposing side 18, 18', 18" as well as the second sides 20', 20" also include corresponding ports for a total of four ports on each device 10, 10', 10". As described above, the total number of ports on a device 10, 10', and 10" may vary depending on the type of device. The illustrated devices 10, 10', 10" may be RS485 devices where, using the first device 10 as an example, a first port 30b is used for power and a second port 30d is used for data (or vice versa). In other examples, IP devices may utilize a single port for both power and data and thus may have only two ports. It is further contemplated that the devices 10, 10', 10" may have fewer than two or more than four ports, as desired or necessary.

Each of the ports 30b, 30d (and those not illustrated) may include two different mechanisms for coupling with another device. For example, using the first device 10 as an example, each port 30b, 30d includes a plurality of terminal pins 44a-b, 44d-e, respectively and a plurality of spring contacts 138a-c and 138d-f, respectively. The ports 30b, 30 may each also include a third pin which is not visible. In FIG. 7, the devices 10, 10', 10" are arranged in a side-by-side arrangement such that the second device 10' is aligned with the first and third devices 10, 10" and the spring contacts (not explicitly shown) on the second side 20' of the second device 10' will form a connection with the corresponding spring contacts (not explicitly shown) on the first side 18 of the adjacent first device 10. Similarly, the spring contacts (not explicitly shown) on the second side 20" of the second device 10" will form a connection with the corresponding spring contacts (not explicitly shown) on the first side 18' of the adjacent second device 10'. As the devices 10, 10', 10" are assembled, an interconnecting structure 82' on the intermediate device 10' may engage a mating tab 84 on the first device 10 and a mating tab 84' on the second device 10' may be received within the interconnecting structure 82" of the third device 10". This may facilitate alignment and assembly.

Figure 8:
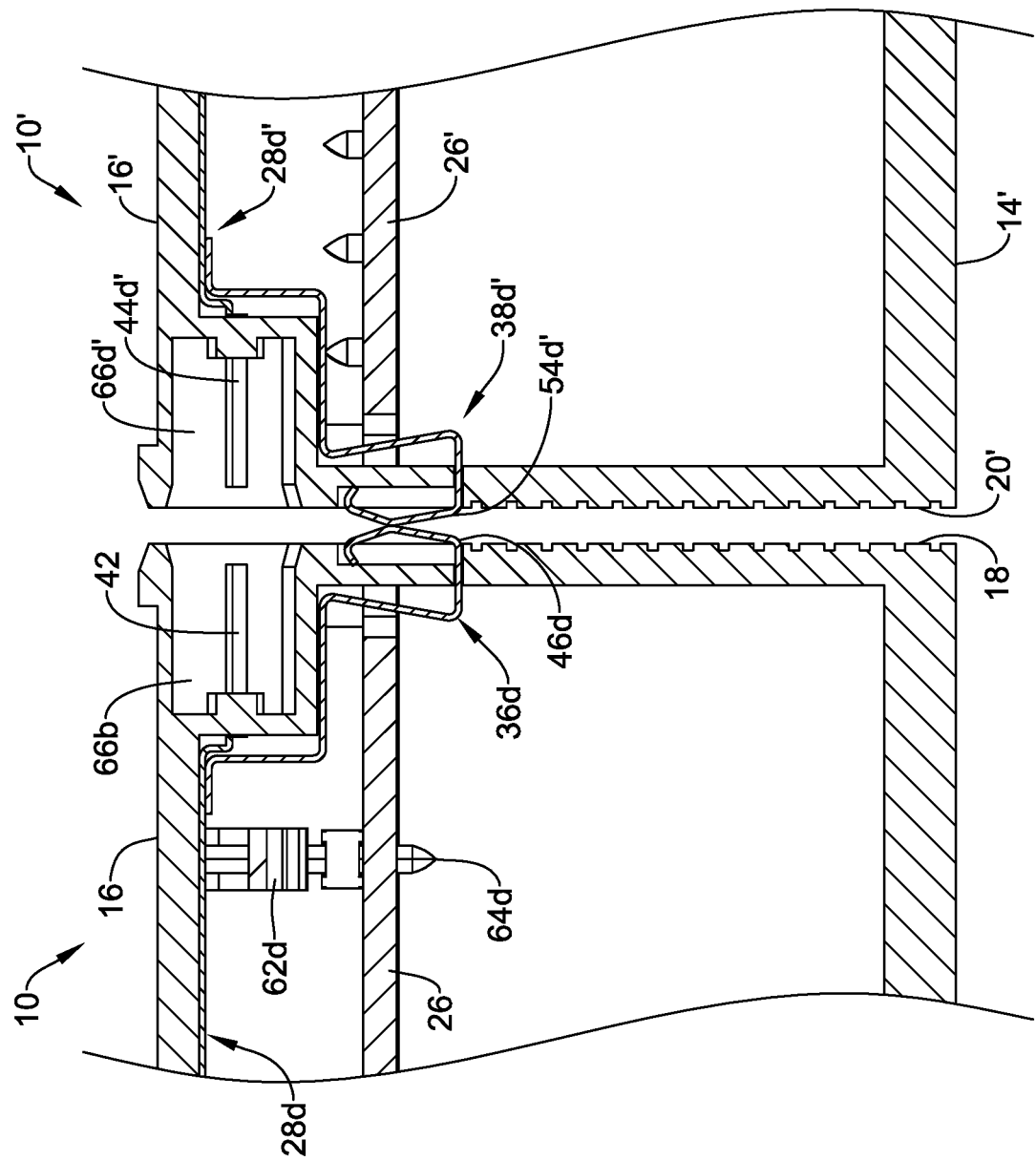
FIG. 8 is a partial cross-sectional view of an illustrative electrical connection between a two adjacent electronic devices.

FIG. 8 illustrates a partial cross-sectional view of an illustrative electrical connection between the first device 10 and the second device 10', taken at line 8-8 of FIG. 7. As can be seen in FIG. 8, when assembled, the back sides 16, 16' and the front sides 14, 14' generally align such that a port 66b on the first device 10 and a port 66' on the second device 10' are also generally aligned. The first side 18 of the first device 10 is adjacent to the second side 20' of the second device 10'. The first side 18 and second side 20' are in close proximity such that the first flexible arm 46d of the first spring contact 36d of the first device 10 contacts and forms and electrical connection the with the first flexible arm 54d' of the second spring contact 38d' of the second device 10'. While present in the devices 10, 10', the terminal pins 42d, 44d' are not required to be coupled to a female terminal connector to form an electrical connection. Also illustrated in FIG. 8 is the connection pin 64d extending from the PCB 26 and received within the terminal receiving slot 62d to electrically connect the PCB 26 to the electrical conductor 28d.

FIG. 9 illustrates a perspective view of another illustrative method for coupling the electronic device 10 to another device. In FIG. 9, a female terminal connector 90 is received within the port 66d and coupled to the terminal pins 44d-f. While not explicitly shown, the terminal connector 90 include one or more wires which are coupled to another device or terminal connector. A female terminal connector 90 may also be coupled with port 66b, if desired or necessary.

Figure 10:
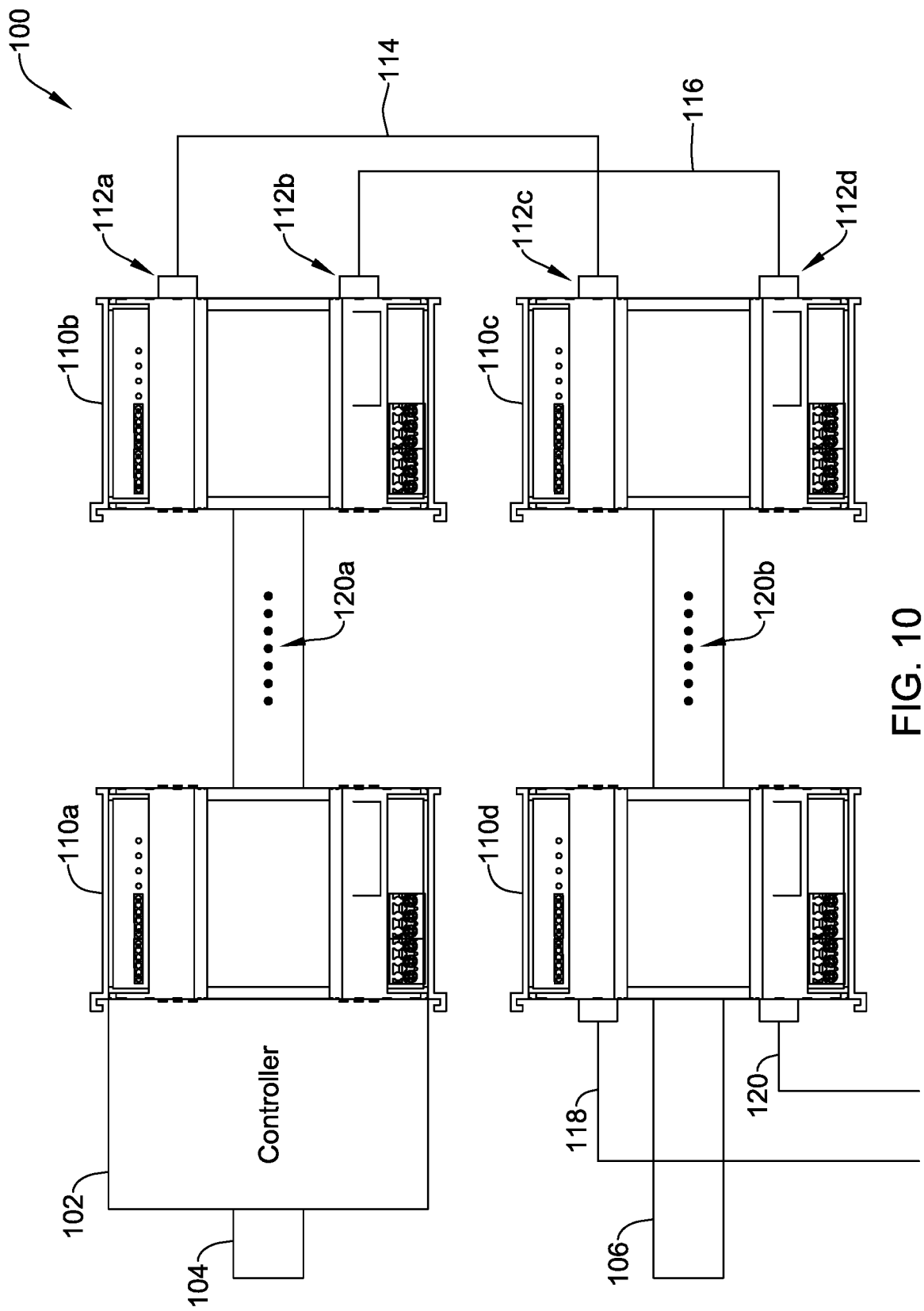
FIG. 10 is a schematic view of control system including a building controller and a plurality of I/O devices.

FIG. 10 illustrates a schematic view of control system 100 including a controller 102 and a plurality of I/O devices 110a-d (collectively, 110). In the illustrative system, the controller 102 and the I/O devices 110 are mounted on a first DIN rail 104 and a second DIN rail 106. However, other mounting techniques may be used, as desired. In the illustrative system, both terminal pins (not explicitly shown) and touch spring contacts (not explicitly shown) are used to connect different devices. For example, a first I/O device 110a is positioned adjacent to the controller 102 in close proximity to bring touch spring contacts on both devices into electrical communication. Similar touch contacts may be made between the first I/O devices 110a and an adjacent device on an opposing side of the first I/O device 110a. Any number of I/O devices 120a may be positioned between the first I/O device 110a and another I/O device 110b. The last I/O device 110b on the first DIN rail 104 may be electrically coupled to another I/O device 110c on the second DIN rail 106. This connection may be made using a power cable 114 having a first terminal connector 112a and a second terminal connector 112c and a data cable 116 having a first terminal connector 112b and a second terminal connector 112d. The terminal connectors 112a-d may be electrically coupled with a plurality of mating terminal pins (as described herein). Touch contacts may be made between the end I/O devices 110c and an adjacent device on an opposing side of the end I/O device 110c. Any number of I/O devices 120 may be positioned between the end I/O device 110c and another I/O device 110d. The I/O device 110 may be coupled to another device (such as another I/O device or the controller 102) using a power cable 118 and/or a data cable 116. It should be understood that in some cases, a single cable may be used to transmit data and power.

The illustrative configuration of FIG. 10 is just one illustrative example of the use of the touch spring contacts and/or the terminal pins to connect control devices. The touch spring contacts may allow for the easy replacement of device that is positioned between two other device while the terminal pins may allow for the connection between a devices that are spaced a distance from one another.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A controller comprising:
a housing including a front, a back and at least a first side and an opposing second side extending between the front and the back;
a printed circuit board housed by the housing;
an electrical connector electrically connected to the printed circuit board, the electrical connector including a first spring contact, a second spring contact, and an electrically conductive bridge mechanically and electrically connecting the first spring contact and the second spring contact, wherein:
the electrically conductive bridge is housed by the housing;
the first spring contact extends outside of the housing and is accessible from the first side of the housing;
the second spring contact extends outside of the housing and is accessible from the second opposing side of the housing;
wherein the electrical connector further comprises a first terminal pin and a second terminal pin, wherein the electrically conductive bridge mechanically and electrically connects the first terminal pin and the second terminal pin, wherein:
the first terminal pin extends outside of the housing and is accessible from the first side of the housing; and
the second terminal pin extends outside of the housing and is accessible from the second opposing side of the housing.

2. The controller of claim 1, wherein:
the electrically conductive bridge comprises a terminal receiving slot;
the printed circuit board comprises a connection pin that is slidably received by the terminal receiving slot to electrically connect the electrical connector to the printed circuit board.

3. The controller of claim 2, wherein the connection pin extends from the printed circuit board toward the back of the housing.

4. The controller of claim 1, wherein:
the first side of the housing defines a first terminal port about the first terminal pin for receiving a female terminal connector; and
the second opposing side of the housing defines a second terminal port about the second terminal pin for receiving a female terminal connector.

5. The controller of claim 4 further comprising:
a second electrical connector electrically connected to the printed circuit board, the second electrical connector including a first spring contact, a second spring contact, and an electrically conductive bridge mechanically and electrically connecting the first spring contact and the second spring contact, wherein:
the electrically conductive bridge of the second electrical connector is housed by the housing;
the first spring contact of the second electrical connector extends outside of the housing and is accessible from the first side of the housing; and
the second spring contact of the second electrical connector extends outside of the housing and is accessible from the second opposing side of the housing;
the second electrical connector further comprising a first terminal pin and a second terminal pin, wherein the electrically conductive bridge of the second electrical connector mechanically and electrically connects the first terminal pin and the second terminal pin of the second electrical connector, wherein:
the first terminal pin of the second electrical connector extends outside of the housing and is accessible from the first side of the housing; and
the second terminal pin of the second electrical connector in extends outside of the housing and is accessible from the second opposing side of the housing.

6. The controller of claim 5 further comprising:
a third electrical connector electrically connected to the printed circuit board, the third electrical connector including a first spring contact, a second spring contact, and an electrically conductive bridge mechanically and electrically connecting the first spring contact and the second spring contact, wherein:
the electrically conductive bridge of the third electrical connector is housed by the housing;
the first spring contact of the third electrical connector extends outside of the housing and is accessible from the first side of the housing; and
the second spring contact of the third electrical connector extends outside of the housing and is accessible from the second opposing side of the housing;
the third electrical connector further comprising a first terminal pin and a second terminal pin, wherein the electrically conductive bridge of the third electrical connector mechanically and electrically connects the first terminal pin and the second terminal pin of the third electrical connector, wherein:

the first terminal pin of the third electrical connector extends outside of the housing and is accessible from the first side of the housing; and the second terminal pin of the third electrical connector in extends outside of the housing and is accessible from the second opposing side of the housing.

7. The controller of claim 1, wherein:

at least part of the first spring contact engages an outside surface of the first side of the housing and at least part of the electrical connector engaged an inside surface of the housing; and at least part of the second spring contact engages an outside surface of the second side of the housing.

8. A controller comprising:

a housing including a front, a back and at least a first side and an opposing second side extending between the front and the back;

a printed circuit board housed by the housing;

an electrical connector electrically connected to the printed circuit board, the electrical connector including a first spring contact, a second spring contact, and an electrically conductive bridge mechanically and electrically connecting the first spring contact and the second spring contact, wherein:

the electrically conductive bridge is housed by the housing;

the first spring contact extends outside of the housing and is accessible from the first side of the housing;

the second spring contact extends outside of the housing and is accessible from the second opposing side of the housing; and wherein the printed circuit board includes a front facing connector that faces and is accessible from the front of the housing.

9. The controller of claim 8, wherein the front facing connector comprise a plurality of pins that extend from the printed circuit board toward the front of the housing.

10. A device comprising:

a housing including a front, a back and at least a first side and an opposing second side extending between the front and the back;

a printed circuit board housed by the housing;

an electrical connector electrically connected to the printed circuit board, the electrical connector including:

a base housed by the housing electrically connected to the printed circuit board;

a spring contact mechanically and electrically connected to the base, the spring contact extends outside of the housing and is accessible from the first side of the housing;

a terminal pin mechanically and electrically connected to the base, the terminal pin extends outside of the housing and is accessible from the first side of the housing; and wherein the first side of the housing defines a terminal port about the terminal pin for receiving a female terminal connector.

11. The device of claim 10, wherein the base includes a terminal receiving slot, and the printed circuit board comprises a connection pin that is slidably received by the terminal receiving slot to electrically connect the electrical connector to the printed circuit board.

12. The device of claim 10, wherein the spring contact extends out from the first side of the housing.

13. The device of claim 10, further comprising:

a second electrical connector electrically connected to the printed circuit board, the second electrical connector including:

a second base housed by the housing electrically connecting to the printed circuit board;

a second spring contact mechanically and electrically connected to the second base, the second spring contact extends outside of the housing and is accessible from the first side of the housing; and a second terminal pin mechanically and electrically connected to the second base, the second terminal pin extends outside of the housing and is accessible from the first side of the housing.

14. The device of claim 13, wherein the first side of the housing defines a terminal port about the terminal pin of the electrical connector and the second terminal pin of the second electrical connector for receiving a female terminal connector.

15. An electrical connector comprising:

a base;

a spring contact mechanically and electrically connected to the base, the spring contact extends away from the base in a first direction; and a terminal pin mechanically and electrically connected to the base, the terminal pin extends away from the base in the first direction and is offset from the spring contact, the terminal pin is configured to receive a female terminal connector.

16. The electrical connector of claim 15, wherein the base includes a terminal receiving slot for slidably receiving a connection pin of a printed circuit board to selectively electrically connect the base to the printed circuit board.

17. The electrical connector of claim 15, wherein the terminal pin and the base are stamped from a common metal plate.

18. The electrical connector of claim 17, wherein the spring contact is welded to the base.

* * * * *